(12) United States Patent
Hosokawa

(10) Patent No.: US 7,041,939 B2
(45) Date of Patent: May 9, 2006

(54) THERMAL PROCESSING APPARATUS AND THERMAL PROCESSING METHOD

(75) Inventor: Akihiro Hosokawa, Kyoto (JP)

(73) Assignee: Dainippon Screen Mfg. Co., Ltd., (JP)

( * ) Notice: Subject to any disclaimer, the term of this patent is extended or adjusted under 35 U.S.C. 154(b) by 0 days.

(21) Appl. No.: 10/985,540

(22) Filed: Nov. 10, 2004

(65) Prior Publication Data

US 2005/0115947 A1 Jun. 2, 2005

(30) Foreign Application Priority Data

Dec. 1, 2003 (JP) ............................. 2003-400964

(51) Int. Cl.
*F27B 5/14* (2006.01)

(52) U.S. Cl. ...................... 219/390; 219/405; 219/411; 392/416; 392/418; 118/724; 118/725; 118/50.1; 118/728; 118/729

(58) Field of Classification Search ................ 219/390, 219/405, 411; 392/416, 418; 118/724, 725, 118/50.1, 728–730
See application file for complete search history.

(56) References Cited

U.S. PATENT DOCUMENTS

| | | | |
|---|---|---|---|
| 4,571,486 A | 2/1986 | Arai et al. | 219/354 |
| 4,649,261 A | 3/1987 | Sheets | 219/390 |
| 5,872,889 A * | 2/1999 | Kaltenbrunner et al. | 392/418 |

FOREIGN PATENT DOCUMENTS

| | | |
|---|---|---|
| EP | 0634785 A1 | 1/1995 |
| JP | 57-162340 | 10/1982 |
| JP | 59-169125 | 9/1984 |
| JP | 60-258928 | 12/1985 |
| JP | 63-166219 | 7/1988 |
| JP | 4-334018 | 11/1992 |
| JP | 7-78863 | 3/1995 |

* cited by examiner

*Primary Examiner*—Shawntina T. Fuqua
(74) *Attorney, Agent, or Firm*—Ostrolenk, Faber, Gerb & Soffen, LLP

(57) ABSTRACT

In a thermal processing apparatus (1), an upper opening (60) is closed by a transparent plate (61) and a light emitting part (5) emits light through the upper opening (60). Also provided are a susceptor (72) for supporting a substrate (9), a hot plate (71) for heating the susceptor (72) and a cover member (21) between the transparent plate (61) and the susceptor (72). The susceptor (72) has a recessed portion whose depth is larger than the thickness of the substrate (9), a lower surface of the substrate (9) is supported by a bottom surface of the recessed portion, and a periphery of the substrate (9) is surrounded by the side wall portion of the recessed portion. During processing of the substrate (9), the cover member (21) is moved down and brought into contact with an upper end of the side wall portion to close the recessed portion. Thus the periphery of the substrate (9) is blocked, so that even if the substrate (9) is broken during processing, the pieces of the substrate are prevented from being scattered.

10 Claims, 8 Drawing Sheets

THERMAL PROCESSING APPARATUS AND THERMAL PROCESSING METHOD

BACKGROUND OF THE INVENTION

1. Field of the Invention

The present invention relates to a thermal processing apparatus for performing a processing accompanied with heating on a substrate and a method therefor.

2. Description of the Background Art

Conventionally, in various stages of a process for manufacturing a semiconductor substrate or the like (hereinafter, referred to simply as "a substrate"), a thermal processing is performed on the substrate, and a rapid thermal process (hereinafter, referred to as "RTP") is used as a method of thermal processing. In the RTP, by heating the substrate in a chamber with halogen lamps or the like to raise the temperature thereof up to a predetermined temperature in a short time, it is possible to perform processings which have been hard to execute by a conventional long thermal processing with an electric furnace, such as thinning of an insulating film such as an oxide film, suppressing of rediffusion of impurities (or dopants) implanted by ion implantation in an activation process, or the like. In recent proposed is a technique for heating a substrate in a shorter time with flash lamps as a heating source for a substrate.

A thermal processing apparatus for performing a thermal processing, not only the RTP, on a substrate has necessity to keep a thermal processing chamber clean so as to avoid deterioration in quality caused by deposition of unnecessary particles on a surface of the substrate, and various techniques to prevent contamination in the thermal processing chamber with the unnecessary particles or the like. For example, Japanese Patent Application Laid Open Gazette No. 7-78863 discloses a technique to prevent evaporation of unnecessary substances on a back surface of a susceptor for supporting the substrate and avoid emergence of particles due to removal of the unnecessary substances by providing an edge portion of the susceptor and an edge portion of a preheating ring in a complementary step-like form.

Further, Japanese Patent Application Laid Open Gazette No. 4-334018 discloses a technique to perform a thermal processing with excellent uniformity by accommodating a substrate in a holder which is made of the same material as the substrate is made of and has almost the same infrared absorptivity, thermal conductivity and the like as the substrate has.

The contamination in a thermal processing chamber is caused by not only the above-discussed particles which emerge when evaporated unnecessary substances are removed but also pieces of a substrate broken in a processing. In a thermal processing using flash lamps, particularly, a substrate is sometimes broken in pieces by quick thermal expansion of its surface since the surface temperature of the substrate rises in an extremely short time.

In a conventional apparatus, since the pieces of the broken substrate are scattered widely in the thermal processing chamber and penetrate into gaps of a complicated structure, in order to remove the contaminants and recover the function of the apparatus, it is necessary to open (sometimes disassemble) the thermal processing chamber for cleaning of the inside thereof and this needs a lot of time and labor. Enlarging the susceptor which holds the substrate is a possible method to suppress the scatter of the substrate pieces near the susceptor, but this method is not a realistic one since it leads to upsizing of a whole thermal processing apparatus.

SUMMARY OF THE INVENTION

The present invention is intended for a thermal processing apparatus for performing a processing accompanied with heating on a substrate, and it is an object of the present invention to suppress scatter of pieces of a substrate even when the substrate is broken.

According to an aspect of the present invention, the thermal processing apparatus comprises a chamber body forming a space in which a substrate is processed, a substrate supporting part for supporting a lower surface of a substrate by a bottom surface of a recessed portion whose depth is larger than a thickness of the substrate and surrounding a periphery of the substrate by a side wall portion of the recessed portion inside the chamber body, a heating part for heating the substrate supporting part, a substantially plate-like cover member disposed above the substrate supporting part, and a closing mechanism for closing the recessed portion by bringing the cover member into contact with an upper end of the side wall portion during a processing of a substrate.

The thermal processing apparatus of the present invention can easily block the periphery of the substrate inside the chamber body when the substrate is heated by the substrate supporting part, and even if the substrate is broken during a processing therefor, it is possible to prevent the pieces of the substrate from being scattered.

Preferably, thermal conductivity of the substrate supporting part is lower than that of a substrate, and it is thereby possible to uniformly heat the substrate by the substrate supporting part.

According to a preferred embodiment of the present invention, the thermal processing apparatus comprises a window member for closing an opening provided in the chamber body for introducing light, and a light emitting part for emitting light from the outside of the opening into the chamber body through the window member, and in the thermal processing apparatus, the cover member is a member for transmitting light emitted from the light emitting part and a substrate supported by the substrate supporting part is heated by light emitted from the light emitting part through the window member and the cover member.

According to another preferred embodiment of the present invention, the thermal processing apparatus comprises a light emitting part for emitting light from the outside of the opening provided in the chamber body into the chamber body, and in the thermal processing apparatus, the cover member is a member for closing the opening and transmitting light emitted from the light emitting part, the closing mechanism moves up the substrate supporting part to bring the side wall portion into contact with a lower surface of the cover member, and a substrate supported by the substrate supporting part is heated by light emitted from the light emitting part through the cover member.

Preferably, the light emitting part having a flash lamp is used.

The present invention is also directed to a thermal processing method for performing a processing accompanied with heating on a substrate These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
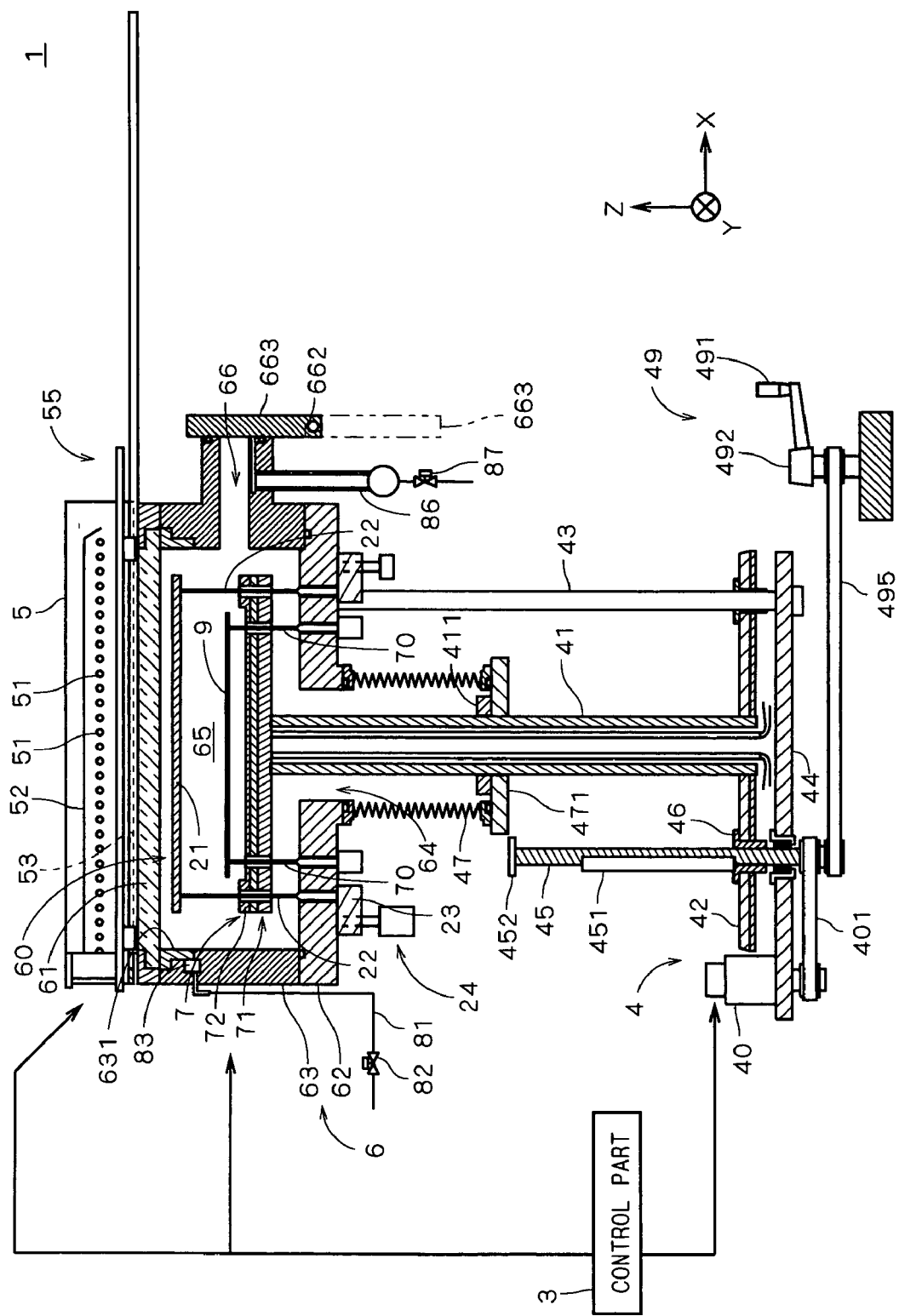
FIG. 1 is a view showing a construction of a thermal processing apparatus.

FIG. 1 is a view showing a construction of a thermal processing apparatus 1 in accordance with one preferred embodiment of the present invention. The thermal processing apparatus 1 is an apparatus for performing a processing accompanied with heating through irradiating a semiconductor substrate 9 (hereinafter, referred to as "substrate 9") with light.

The thermal processing apparatus 1 comprises a chamber side part 63 having a substantially-cylindrical inner wall and a chamber bottom 62 covering a lower portion of the chamber side part 63, which constitute a chamber body 6 forming a space (hereinafter, referred to as "chamber") 65 for thermally processing the substrate 9 and provided with an opening (hereinafter, referred to as "upper opening") 60 for introducing light in its upper portion.

The thermal processing apparatus 1 further comprises a transparent plate 61 attached to the upper opening 60 of the chamber body 6, a substantially disk-shaped holding part 7 for holding the substrate 9 inside the chamber body 6 and executing a preliminary heating on the substrate 9, a cover member 21 disposed between the transparent plate 61 and the holding part 7, a holding-part moving mechanism 4 for vertically moving the holding part 7 with respect to a bottom of the chamber body 6, i.e., the chamber bottom 62, a light emitting part 5 for heating the substrate 9 on the holding part 7 by emitting light from the outside of the upper opening 60 into the chamber body 6 through the transparent plate 61, and a control part 3 for controlling these constituent elements to perform a thermal processing.

The transparent plate 61 is formed of a material having infrared transmissivity such as quartz and serves as a window member (i.e., a chamber window) for closing the upper opening 60 and transmitting the light emitted from the light emitting part 5 into the chamber 65. The chamber bottom 62 and the chamber side part 63 are formed of metal material such as stainless steel having excellent strength and heat resistance, and a ring 631 in an upper portion of an inner side surface of the chamber side part 63 is formed of aluminum (Al) alloy or the like having more excellent resistance than stainless steel to degradation caused by light irradiation.

On the chamber bottom 62, a plurality of (in the present preferred embodiment, three) support pins 70 stand to support the substrate 9 being in contact with its lower surface (on the side opposite to a side irradiated with light by the light emitting part 5) through the holding part 7. The support pin 70 is formed of, e.g., quartz, and easy to replace as it is fixed from the outside of the chamber body 6.

The chamber bottom 62 is further provided with a plurality of cover supporting pins 22 for supporting the plate-like cover member 21 disposed above the holding part 7 from its lower side. The plurality of cover supporting pins 22 penetrate the chamber bottom 62 and are fixed to an annular member 23 outside the chamber body 6, and the annular member 23 is connected to a cover moving mechanism 24 having a motor. When the control part 3 controls to drive the cover moving mechanism 24, the plurality of cover supporting pins 22 are vertically moved as a unit and the cover member 21 is thereby moved in the Z direction of FIG. 1. The cover member 21 is also formed of a material having infrared transmissivity such as quartz, like the transparent plate 61.

The chamber side part 63 has a transfer opening 66 used for loading and unloading of the substrate 9, and the transfer opening 66 is made openable/closable by a gate valve 663 which rotates about an axis 662. On a portion of the chamber side part 63 which is opposite to the transfer opening 66, a gas introduction path 81 is formed to introduce a process gas (e.g., inert gas such as nitrogen ($N_2$) gas, helium (He) gas or argon (Ar) gas, or oxygen ($O_2$) gas) into the chamber 65, whose one end is connected to a not-shown gas supply mechanism through a valve 82 and other end is connected to a gas introduction channel 83 formed inside the chamber side part 63. In the transfer opening 66 formed is a gas exhaust path 86 for exhausting air from the chamber, which is connected to a not-shown gas exhaust mechanism through a valve 87.

Figure 2:
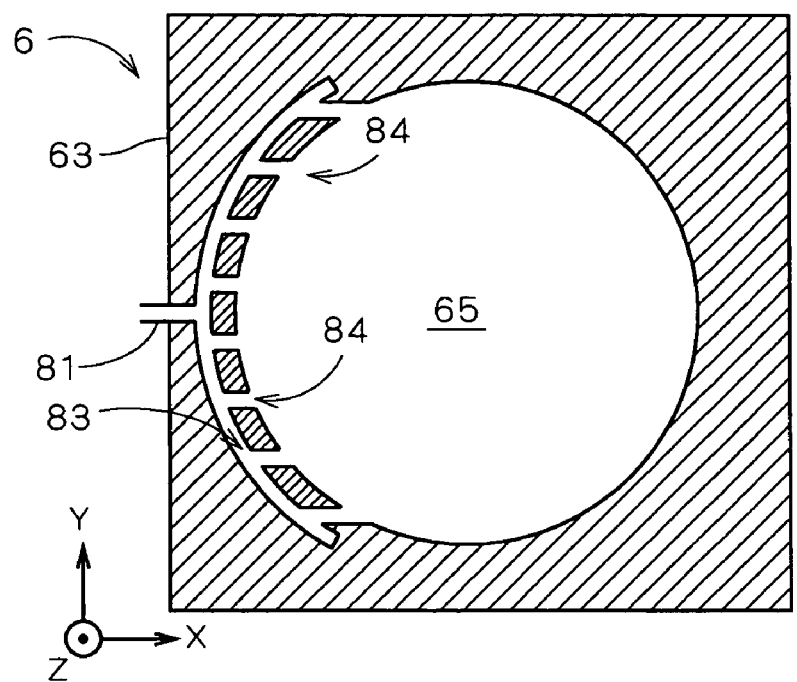
FIG. 2 is a cross section showing a gas path.

FIG. 2 is a cross section of the chamber body 6 taken along a plane perpendicular to the Z direction at a position of the gas introduction channel 83. As shown in FIG. 2, the gas introduction channel 83 is so formed as to cover about one-third of a perimeter of the chamber side part 63 on the side opposite to the transfer opening 66 of FIG. 1, and the process gas introduced by the gas introduction channel 83 through the gas introduction path 81 is supplied to the inside of the chamber 65 from a plurality of gas supply holes 84.

The holding-part moving mechanism 4 of FIG. 1 has a substantially-cylindrical shaft 41, a moving plate 42, guide members 43 (in the present preferred embodiment, three guide members are arranged around the shaft 41), a fixed plate 44, a ball screw 45, a nut 46 and a motor 40. In the chamber bottom 62 which is lower portion of the chamber body 6, an opening (hereinafter, referred to as "lower opening") 64 of substantial circle having a diameter smaller than that of the holding part 7 is formed and the shaft 41 of stainless steel is inserted into the lower opening 64 and connected to a lower surface of the holding part 7 (a hot plate 71) to support the holding part 7.

The nut 46 into which the ball screw 45 is inserted is fixed to the moving plate 42, and the moving plate 42 is made vertically movable, being guided by the guide members 43 which are fixed to the chamber bottom 62, extending downward, and the moving plate 42 is connected to the holding part 7 through the shaft 41.

The motor 40 is disposed on the fixed plate 44 attached to lower end portions of the guide members 43 and connected to the ball screw 45 through a timing belt 401. When the holding part 7 is vertically moved by the holding-part moving mechanism 4, the motor 40 serving as a driving part is controlled by the control part 3 to rotate the ball screw 45, thereby moving the moving plate 42 to which the nut 46 is fixed along the guide members 43. As a result, the shaft 41 is moved along the Z direction of FIG. 1 and the holding part 7 connected to the shaft 41 smoothly moves up and down inside the chamber body 6 during the thermal processing for the substrate 9.

A mecha-stopper 451 of substantial semicylinder (shape of cylinder cut half along a longitudinal direction) stands on an upper surface of the moving plate 42 along the ball screw 45, and even if the moving plate 42 moves up over a predetermined rising limit due to some abnormal conditions, it is possible to prevent abnormal rise of the moving plate 42 as an upper end of the mecha-stopper 451 is pushed against an end plate 452 which is provided at an end portion of the ball screw 45. This prevents the holding part 7 from moving up over a predetermined position below the transparent plate 61 to avoid the collision between the holding part 7 and the transparent plate 61.

The holding-part moving mechanism 4 has a manual moving part 49 for manually moving the holding part 7 up and down during the maintenance for the inside of the chamber body 6. The manual moving part 49 has a handle 491 and a rotation axis 492, and with rotation of the rotation axis 492 through the handle 491, the ball screw 45 connected to the rotation axis 492 through a timing belt 495 is rotated to move the holding part 7 up and down. Though the handle 491 is seen on the side for loading/unloading of substrates in the thermal processing apparatus 1 of FIG. 1, for convenience of illustration, it is preferable that the handle 491 should be disposed on a side surface of the thermal processing apparatus 1 in the Y-axis direction.

The chamber bottom 62 is provided with extensible bellows 47 which can so extend downward as to surround the shaft 41, whose upper end is connected to the lower surface of the chamber bottom 62. The other end of the bellows 47 is provided with a bellows lower-end plate 471, which is screwed onto a brim-like member 411 attached to the shaft 41, to thereby keep the inside of the chamber 65 airtight. The bellows 47 is contracted when the holding part 7 is moved up with respect to the chamber bottom 62 by the holding-part moving mechanism 4 and extended when the holding part 7 is moved down.

The holding part 7 has a hot plate 71 used for preheating (assist heating) of the substrate 9 and a susceptor 72 disposed on an upper surface of the hot plate 71 (a surface on the side where the holding part 7 holds the substrate 9), and as discussed above, the shaft 41 used for vertically moving the holding part 7 is connected to the lower surface of the holding part 7 (the hot plate 71).

Figure 3:
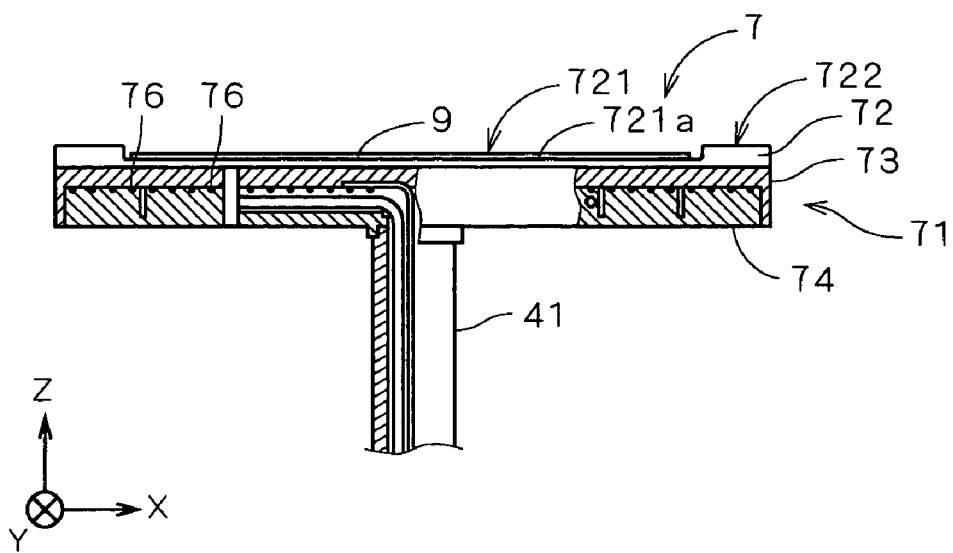
FIG. 3 is a cross section showing a holding part and a shaft.

FIG. 3 is a cross section showing the holding part 7 and the shaft 41. As shown in FIG. 3, a recessed portion 721 whose depth is larger than the thickness of the substrate 9 is formed in the susceptor 72 and the substrate 9 is placed inside the recessed portion 721. In other words, the lower surface of the substrate 9 is supported by a bottom surface 721*a* of the recessed portion 721 (a surface facing upward inside the recessed portion 721) and the periphery of the substrate 9 is surrounded by a side wall portion 722 of the recessed portion 721 (in other words, an annular portion in the rim of the susceptor 72, whose upper end surface is higher in level than the surface of the substrate 9). Though a surface of the side wall portion 722 which faces inward is formed like a cylinder almost perpendicular to the bottom surface 721*a* of the recessed portion 721 in FIG. 3, the surface may be an inclined surface, for example, whose diameter increases as goes upward).

The susceptor 72 is formed of quartz and its thermal conductivity is lower than that of the substrate 9 (e.g., a substrate formed of silicon), and since the susceptor 72 is placed on the hot plate 71 in surface-to-surface contact between the lower surface of the susceptor 72 and the upper surface of the hot plate 71, when the susceptor 72 is heated by the hot plate 71, the thermal energy from the hot plate 71 is diffused and transmitted to the substrate 9. The substrate 9 is thereby heated uniformly. During maintenance, the susceptor 72 can be detached from the hot plate 71 for cleaning.

The hot plate 71 has an upper plate 73 and a lower plate 74 both of stainless steel, and resistance heating wires 76 such as nichrome wires for heating the hot plate 71 are provided between the upper plate 73 and the lower plate 74, which are filled with conductive nickel (Ni) brazing filler metals and sealed. End portions of the upper plate 73 and the lower plate 74 are bonded to each other by brazing.

Figure 4:
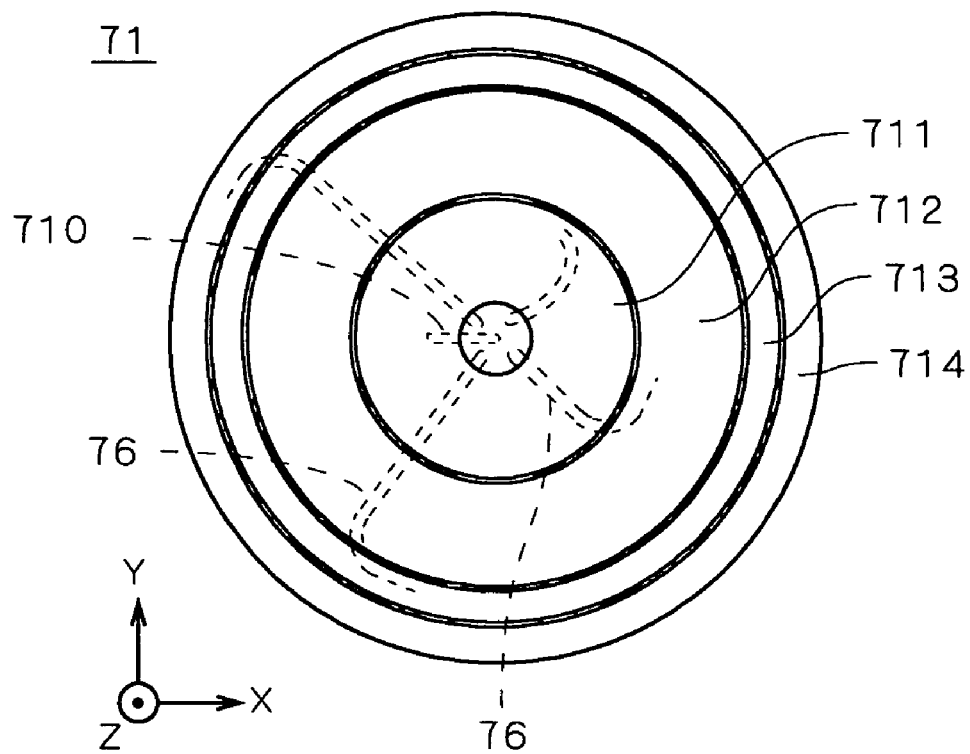
FIG. 4 is a plan view showing a hot plate.

FIG. 4 is a plan view showing the hot plate 71. As shown in FIG. 4, the hot plate 71 is concentrically divided into four zones 711, 712, 713 and 714, and a gap is provided between one zone and the adjacent zone. The zones 711 to 714 are provided with the resistance heating wires 76 which are independent from one another in a rounding manner and heated by these resistance heating wires 76, respectively.

The innermost zone 711 is provided with a sensor 710 for measuring the temperature of the zone 711 with a thermocouple, and the sensor 710 is connected to the control part 3 through the inside of the substantially-cylindrical shaft 41 (see FIG. 3). When the hot plate 71 is heated, the control part 3 controls the amount of power supply for the resistance heating wire 76 provided in the zone 711 so that the temperature of the zone 711 which is measured by the sensor 710 should become a predetermined temperature. The control part 3 controls the temperature of the zone 711 by PID (Proportional, Integral, Differential) control. The amount of power supply for the resistance heating wire 76 provided in each of the zones 712 to 714 is determined on the basis of the amount of power supply for that in the zone 711, according to a predefined correspondence table (correspondence between the amount of power supply for the zone 711 and that required to make the temperatures of the other zones 712 to 714 equal to that of the zone 711). In the hot plate 71, the temperature of the zone 711 is continuously measured until the thermal processing for the substrate 9 (if a plurality of substrates 9 are successively processed, the thermal processing for all the substrates 9) is finished, and with this control, the temperatures of the zones 711 to 714 are kept to be target temperatures.

Figure 5:
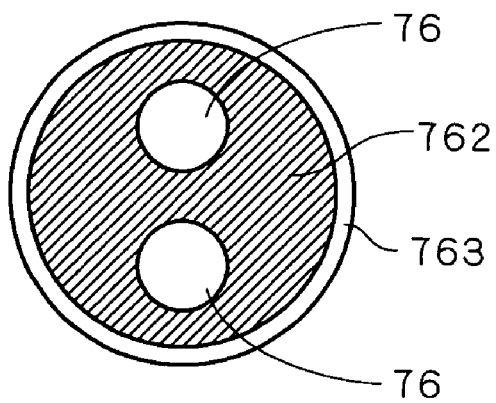
FIG. 5 is a cross section showing resistance heating wires.

The respective resistance heating wires 76 provided in the zones 711 to 714 are connected to a power supply source (not shown) through the inside of the shaft 41, and from the power supply source to the respective zones, two parts of the resistance heating wire 76 from and to the power supply source are so arranged as to be electrically insulated from each other inside a stainless tube 763 filled with an insulative material 762 such as magnesia (magnesium oxide), as shown in the cross section of FIG. 5. The inside of the shaft 41 is open to the air.

The light emitting part 5 of FIG. 1 has a plurality of (in the present preferred embodiment, thirty) xenon flash lamps (hereinafter, referred to simply as "flash lamps") 51, a reflector 52 and a light diffusion plate 53. A plurality of flash lamps 51 are rod lamps of long cylindrical shape and arranged so that their longitudinal directions (the Y direction of FIG. 1) should be parallel to one another along a main surface of the substrate 9 held by the holding part 7. The reflector 52 is so provided as to entirely cover upper portions of the flash lamps 51 and its surface is roughened by abrasive blasting to have a satin finish. The light diffusion plate 53 is formed of fused quartz whose surface is photo-diffused and disposed on a lower surface of the light emitting part 5 with a predetermined gap between itself and the transparent plate 61. The thermal processing apparatus 1 further comprises an emitting-part moving mechanism 55 used for relatively moving the light emitting part 5 with respect to the chamber body 6 in the X direction of FIG. 1 during maintenance.

Figure 6:
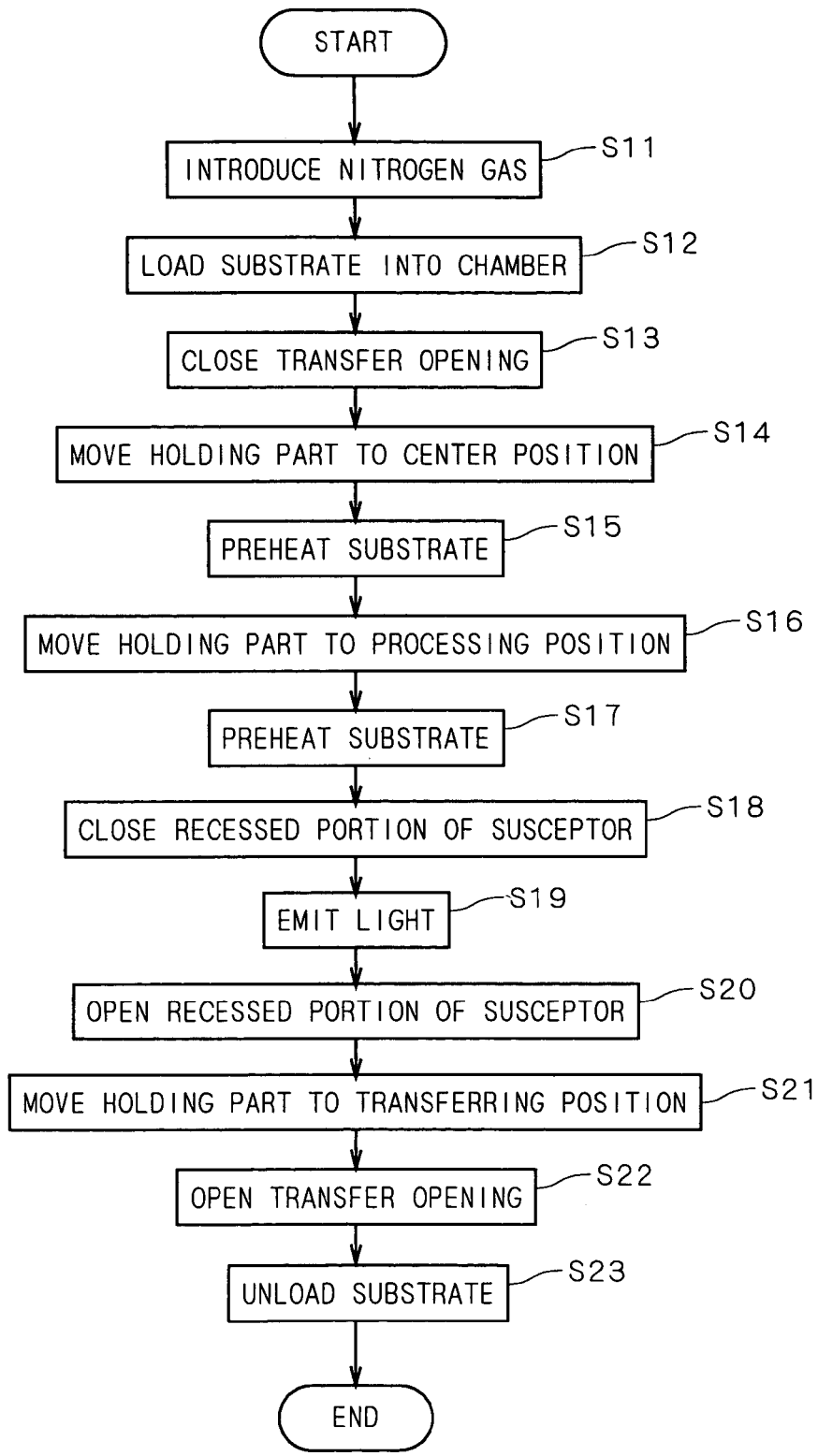
FIG. 6 is a flowchart showing an operation flow of the thermal processing apparatus during a processing operation.

FIG. 6 is a flowchart showing an operation flow of the thermal processing apparatus 1 for performing a thermal processing on the substrate 9. In the present preferred embodiment, the substrate 9 is a semiconductor substrate which is implanted with impurities by ion implantation and the implanted impurities are activated by the thermal processing in the thermal processing apparatus 1.

To perform a thermal processing on the substrate 9 in the thermal processing apparatus 1, first, the holding part 7 is arranged near the chamber bottom 62 as shown in FIG. 1. Hereinafter, the position of the holding part 7 in the chamber 65 shown in FIG. 1 is referred to as "transferring position". When the holding part 7 stays at the transferring position, tips of the support pins 70 are positioned above the holding part 7, through the holding part 7. Next, the valves 82 and 87 are opened to introduce room-temperature nitrogen gas into the chamber 65 (Step S11). Subsequently, the transfer opening 66 is opened and the substrate 9 is loaded into the chamber 65 through the transfer opening 66 by a transfer robot (not shown) controlled by the control part 3 (Step S12) and put on a plurality of support pins 70.

Figure 7:
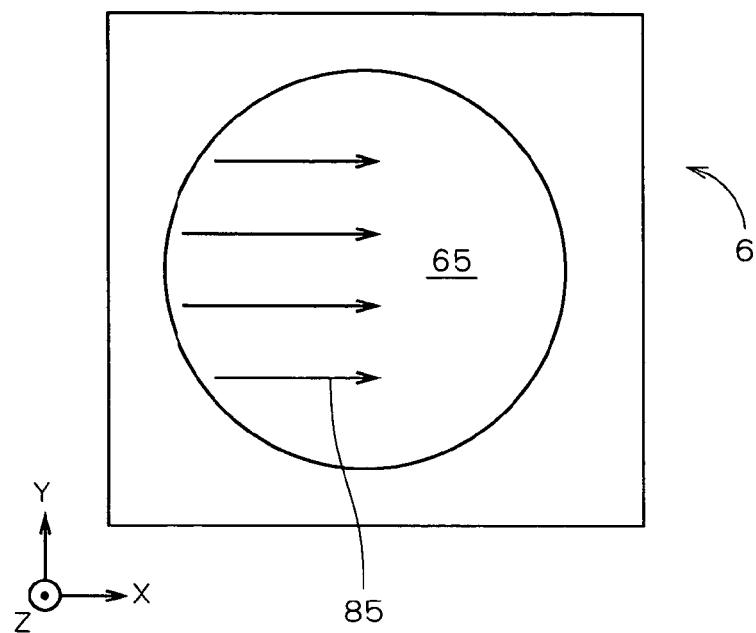
FIG. 7 is a view showing a flow of gas.

FIG. 7 is a view abstractly showing the chamber body 6 of FIG. 2. The amount of nitrogen gas to be purged into the chamber 65 in loading of the substrate 9 is about 40 l/min, and the supplied nitrogen gas flows to a direction indicated by the arrow 85 of FIG. 7 in the chamber 65 and exhausted through the gas exhaust path 86 and the valve 87 of FIG. 1 by utility exhaust. Part of the nitrogen gas supplied to the chamber 65 is exhausted also from an exhaust port (not shown) which is provided at the inner side of the bellows 47. In each of the following steps, the nitrogen gas is continuously supplied to and exhausted from the chamber 65 and the amount of nitrogen gas to be purged is changed variously in accordance with the process steps for the substrate 9.

When the substrate 9 is loaded into the chamber 65, the gate valve 663 of FIG. 1 closes the transfer opening 66 (Step S13), and the holding-part moving mechanism 4 moves the holding part 7 up to a position near the center (hereinafter, referred to as "center position") along the vertical direction (the Z direction of FIG. 1) of the chamber 65 (Step S14). At this time, the substrate 9 is passed from the support pins 70 to the susceptor 72 of the holding part 7 and held by the susceptor 72. The holding part 7 has been heated up to a predetermined temperature by the resistance heating wires 76 inside the hot plate 71 (between the upper plate 73 and the lower plate 74) and preheating of the substrate 9 is performed by bringing the substrate 9 into contact with the holding part 7 (the susceptor 72) (Step S15), to thereby allows gradual increase in temperature of the substrate 9. In the holding part 7, as discussed above, the substrate 9 is uniformly preheated since the thermal energy from the hot plate 71 is diffused by the susceptor 72.

Figure 8:
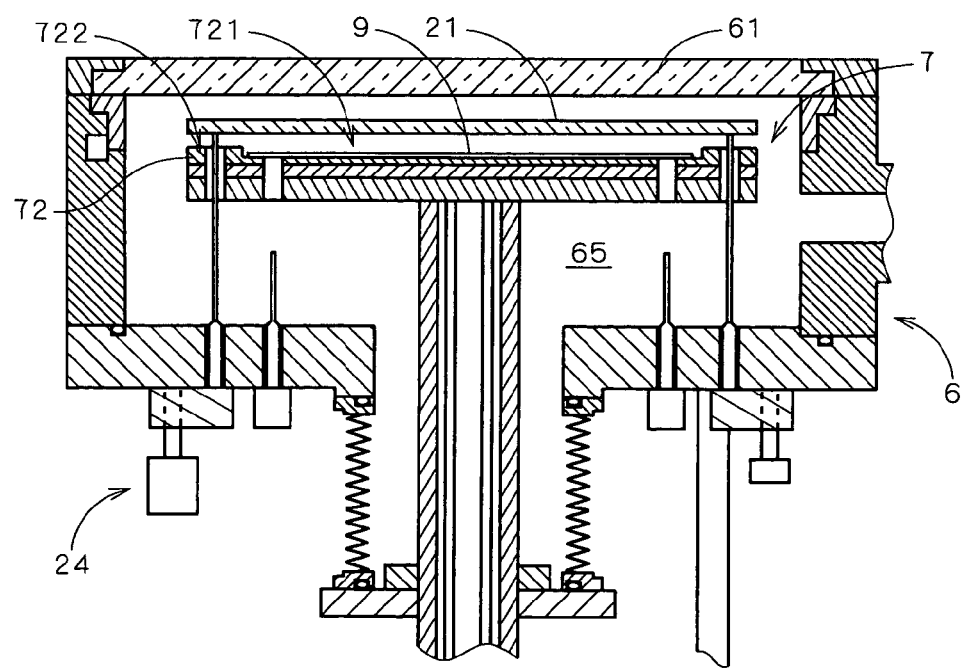
FIG. 8 is a view for explanation on movement of the holding part.

After the preheating is performed for about one second at the center position, the holding part 7 is moved by the holding-part moving mechanism 4 (see FIG. 1) up to a position near the transparent plate 61 (hereinafter, referred to as "processing position") as shown in FIG. 8 (Step S16) and further preheated for about sixty seconds at this position, and the temperature of the substrate 9 thereby rises up to a predetermined temperature through preheating (hereinafter, referred to as "setting temperature") (Step S17). The setting temperature is in a range from about 200° C. to 600° C. where there is no possibility that the impurities implanted in the substrate 9 should be diffused, preferably from about 350° C. to 550° C. The distance between the holding part 7 and the transparent plate 61 can be arbitrarily controlled by controlling the amount of rotation of the motor 40 in the holding-part moving mechanism 4.

While the substrate 9 is preheated up to the setting temperature, the cover member 21 is moved down by the cover moving mechanism 24 and put on the side wall portion 722 of the susceptor 72, coming into contact with an upper end thereof, to close the recessed portion 721 (Step S18). In other words, inside the chamber body 6, the periphery of the substrate 9 is blocked by the susceptor 72 and the cover member 21. This makes it possible to prevent deposition of unnecessary substances such as particles on the substrate 9 in the following process steps.

Figure 9:
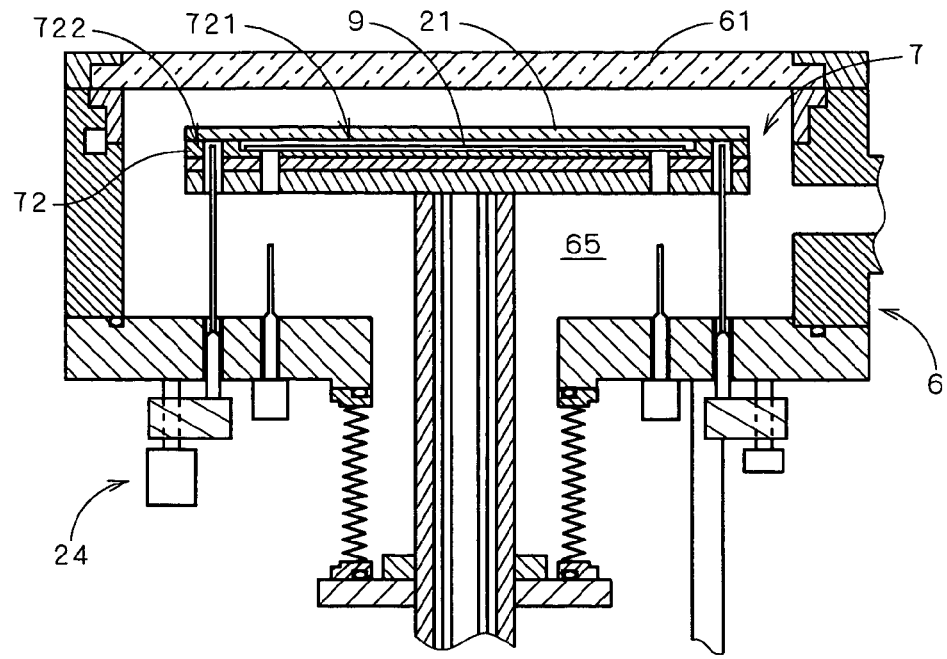
FIG. 9 is a view for explanation on closure of a recessed portion of a susceptor.

After that, while the holding part 7 stays at the processing position, the control part 3 controls the light emitting part 5 (see FIG. 1) to emit flash light to the substrate 9 (Step S19). At this time, part of the light emitted from the flash lamps 51 of the light emitting part 5 goes through the light diffusion plate 53 and the transparent plate 61 directly towards the inside of the chamber 65 and other part of the light is reflected on the reflector 52, going through the light diffusion plate 53 and the transparent plate 61 to the inside of the chamber 65. Then, these lights are emitted to the substrate 9 through the cover member 21 of FIG. 9 to irradiate the substrate 9 to be heated (hereinafter, the heating to raise the surface temperature of the substrate 9 up to the processing temperature is referred to as "main heating" for being distinguished from preheating). Since the main heating is performed by light irradiation, it is possible to increase and decrease the surface temperature of the substrate 9 in a short time.

The light emitted from the light emitting part 5, i.e., the flash lamps 51 is an extremely short and strong flash whose irradiation time ranges from about 0.1 to 10 milliseconds, which is obtained by converting electrostatic energy stored in advance into an extremely short light pulse, and with the light emitted from the flash lamps 51, the surface temperature of the substrate 9 which is mainly heated momentarily rises up to the processing temperature ranging from about 1000° C. to 1100° C. and quickly falls after activating the impurities implanted in the substrate 9. Thus, in the thermal processing apparatus 1, since the surface temperature of the substrate 9 can increase and decrease in an extremely short time, it is possible to activate the impurities implanted in the substrate 9 while suppressing diffusion of the impurities caused by heating (the diffusion is sometimes referred to as broadening of profile of impurities in the substrate 9). By preheating of the substrate 9 with the holding part 7 prior to its main heating, it is possible to quickly raise the surface temperature of the substrate 9 with irradiation of light from the flash lamps 51 up to the processing temperature.

In the thermal processing apparatus 1, since the surface temperature of the substrate 9 is raised in an extremely short time, there are a few cases where the substrate 9 is broken into pieces and scattered due to quick thermal expansion of the surface irradiated with light. Even if the substrate 9 is broken, however, since the substrate 9 is placed inside a space closed by the susceptor 72 and the cover member 21, the pieces of the substrate 9 are not scattered outside this space.

After the main heating is finished and the holding part 7 stays waiting for about ten seconds at the processing position, the cover member 21 is moved up by the cover moving mechanism 24 to open the recessed portion 721 (Step S20) and then the holding part 7 moved down to the transferring position shown in FIG. 1 again by the holding-part moving mechanism 4 (Step S21), and the substrate 9 is transferred from the holding part 7 to the support pins 70. Subsequently, the transfer opening 66 which has been closed by the gate valve 663 is opened (Step S22) and the substrate 9 put on the support pins 70 is unloaded by the transfer robot (Step S23). Thus, a series of operations for thermal processing on the substrate 9 by the thermal processing apparatus 1 is completed.

As discussed above, the nitrogen gas is continuously supplied into the chamber 65 during the thermal processing on the substrate 9 by the thermal processing apparatus 1, and the amount of nitrogen gas to be purged is 30 l/min when the holding part 7 stays at the processing position (in other words, during a period from the time when the holding part 7 is moved to the processing position after the preheating for about one second at the center position to the time when the waiting for about ten seconds after light irradiation is finished) and 40 l/min when the holding part 7 stays at any position other than the processing position.

In the thermal processing apparatus 1, when the same thermal processing is performed on a new substrate 9, such operations as loading of the substrate 9 into the chamber 65, light irradiation and unloading of the substrate 9 from the chamber 65 (Steps S12 to S23) are repeated. When a different thermal processing is performed on a new substrate 9, the holding part 7 moves up to the processing position and stays waiting there while various settings are made in accordance with the new thermal processing (such as setting of the amount of nitrogen gas to be purged). By keeping the temperature of the transparent plate 61 to be almost equal to a temperature at the time when the thermal processings are continuously performed, it is possible to keep the quality of processing on the substrate 9 in the new thermal processing.

The thermal processing apparatus 1 comprises various constituents for cooling (not shown) so as to prevent excessive increase in temperature of the chamber body 6 and the light emitting part 5 with thermal energy generated from the flash lamps 51 and the hot plate 71 during the thermal processing for the substrate 9. For example, the chamber side part 63 and the chamber bottom 62 in the chamber body 6 are provided with water-cooling tubes, and the light emitting part 5 is provided therein with a supply tube for supplying air and an exhaust tube with silencer to form an air-cooled structure. Compressed air is supplied into the gap between the transparent plate 61 and (the light diffusion plate 53 of) the light emitting part 5, to thereby cool the light emitting part 5 and the transparent plate 61.

In the thermal processing apparatus 1, as discussed above, the susceptor 72 inside the chamber body 6 is provided with the recessed portion 721 whose depth is larger then the thickness of the substrate 9 and the substrate 9 is placed inside the recessed portion 721 and preheated by the hot plate 71 through the susceptor 72. Then, the cover moving mechanism 24 moves the cover member 21 down to close the recessed portion 721 and the main heating is performed on substrate 9 with light emitted from the light emitting part 5 through the transparent plate 61 and the cover member 21. This makes it possible to easily block the periphery of the substrate 9 while the substrate 9 is preheated by the susceptor 72 inside the chamber body 6 in the thermal processing apparatus 1, and as a result, even if the substrate 9 is broken during the main heating thereof, it is possible to prevent the pieces of the substrate 9 from being scattered.

Since the susceptor 72 and the hot plate 71 are independent members in the thermal processing apparatus 1, during the maintenance in a case where the substrate 9 is broken, it is not necessary to perform any complicated operation, i.e., removal of the hot plate 71, and only the cover member 21 and the susceptor 72 have to be removed and cleaned, and this ensures improvement in efficiency of maintenance (in other words, simplifies the maintenance) of the thermal processing apparatus 1.

In the thermal processing apparatus 1, since the surface temperature of the substrate 9 can rise and fall in a short time through irradiation of light emitted from the light emitting part 5, it is possible to achieve a processing which is hard to execute through a long heating, e.g., thinning of an insulating film such as an oxide film, or the like. The thermal processing apparatus 1 uses the flash lamps 51 as a light source, which allows the surface temperature of the substrate to rise and fall in an extremely short time, and it is therefore possible to achieve a processing which requires heating for a still shorter time, such as suppressing of rediffusion of impurities in activation of impurities implanted by ion implantation.

Figure 10:
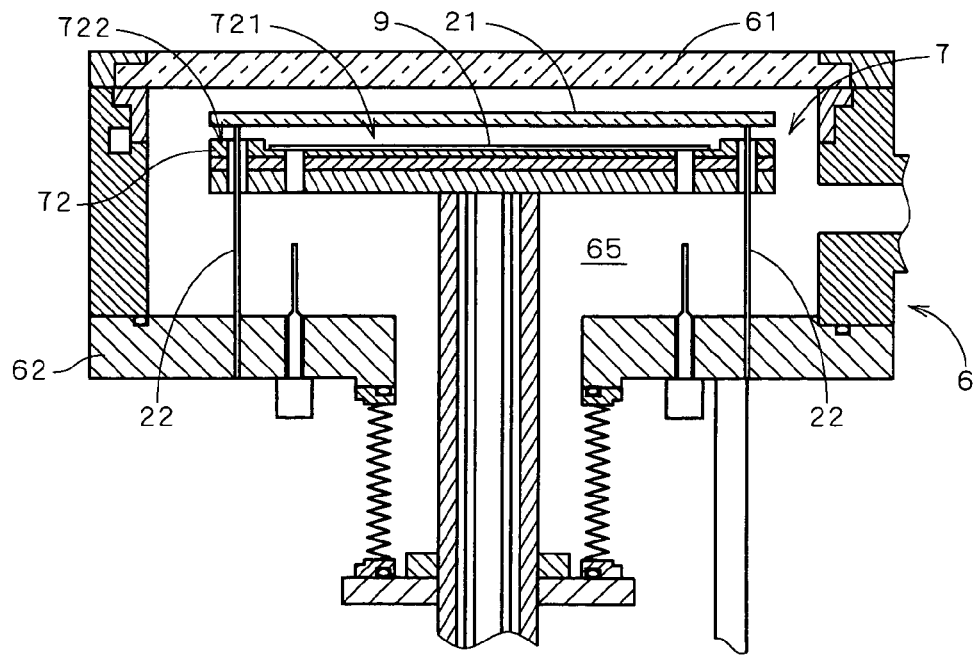
FIG. 10 is a view showing another construction of a thermal processing apparatus.

FIG. 10 is a view showing another construction of a thermal processing apparatus, which only shows the inside of the chamber body 6. The thermal processing apparatus 1 of FIG. 10 is different from the thermal processing apparatus 1 of FIG. 1 in that a plurality of cover supporting pins 22 for supporting the cover member 21 are fixed to the chamber bottom 62, and other constituents are the same as those of FIG. 1 and represented by the same reference signs.

Figure 11:
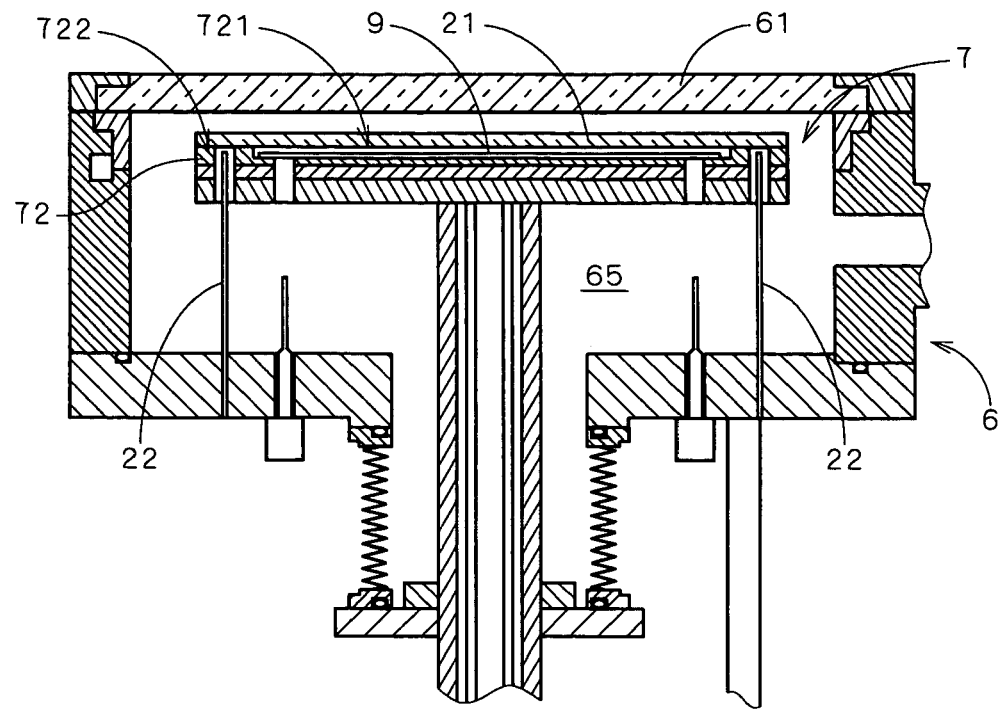
FIG. 11 is a view for explanation on closure of the recessed portion of the susceptor.

In the thermal processing apparatus 1 of FIG. 10, the operation of Step S18 in the flow of FIG. 6 is achieved by the operation of Step S16. Specifically, the cover member 21 is supported by a plurality of cover supporting pins 22 at the position corresponding to the processing position of the holding part 7, and as shown in FIG. 11, the holding-part moving mechanism 4 (see FIG. 1) moves the holding part 7 up to the processing position (Step S16) and the cover member 21 is thereby moved from the cover supporting pins 22 onto the side wall portion 722 of the susceptor 72 to close the recessed portion 721 (Step S18). After the substrate 9 is preheated by the susceptor 72 (Step S17), the substrate 9 is heated up to the setting temperature by the light emitted from the light emitting part 5 (Step S19). Similarly, Step S20 for opening the recessed portion 721 is achieved by the operation of Step S21.

In the thermal processing apparatus 1 of FIG. 10, it is thereby possible to close the recessed portion 721 of the susceptor 72 during the main heating with a simple construction, without providing a mechanism for moving the cover member 21 (specifically, the cover moving mechanism 24 of FIG. 1). As a result, even if the substrate 9 is broken during the processing, the cover member 21 serves as a spatter guard plate and it is thereby possible to easily and quickly recover the function of the thermal processing apparatus only by detaching and cleaning the susceptor 72 and the cover member 21 without any complicated operation such as disassembly and cleaning of the chamber body 6.

Figure 12:
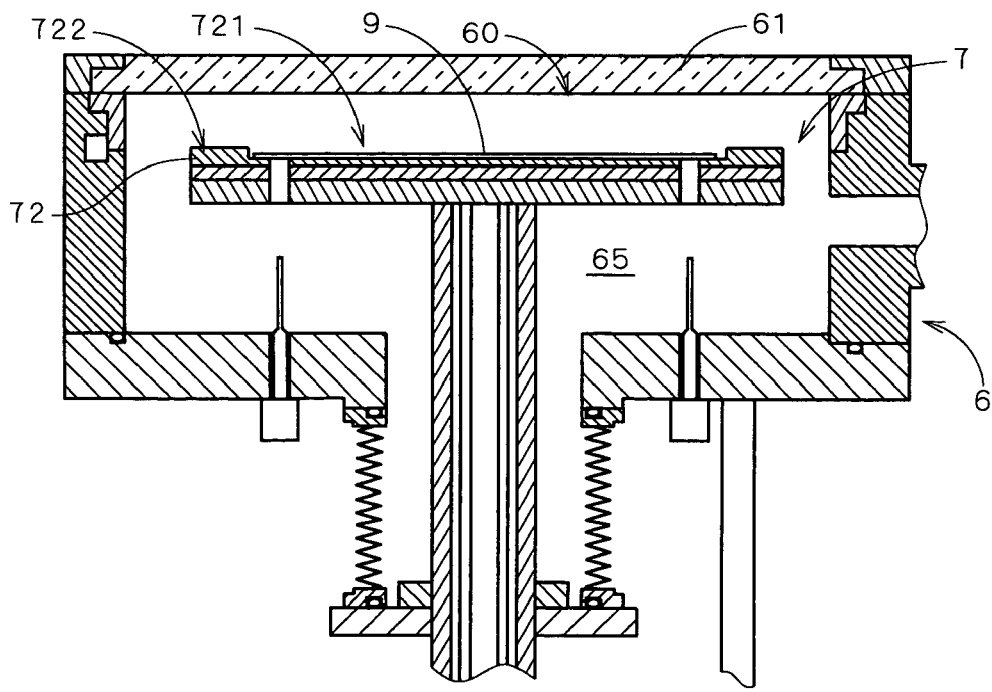
FIG. 12 is a view showing still another construction of a thermal processing apparatus.

FIG. 12 is a view showing still another construction of a thermal processing apparatus, which only shows the inside of the chamber body 6. The thermal processing apparatus 1 of FIG. 12 is different from the thermal processing apparatus 1 of FIG. 10 in that the cover member 21 and a plurality of cover supporting pins 22 are not provided, and other constituents are the same as those of FIG. 1. In the thermal processing apparatus 1 of FIG. 12, the length of the mechastopper 451 is changed so that the holding part 7 can be moved to such a position as to come into contact with the transparent plate 61.

Figure 13:
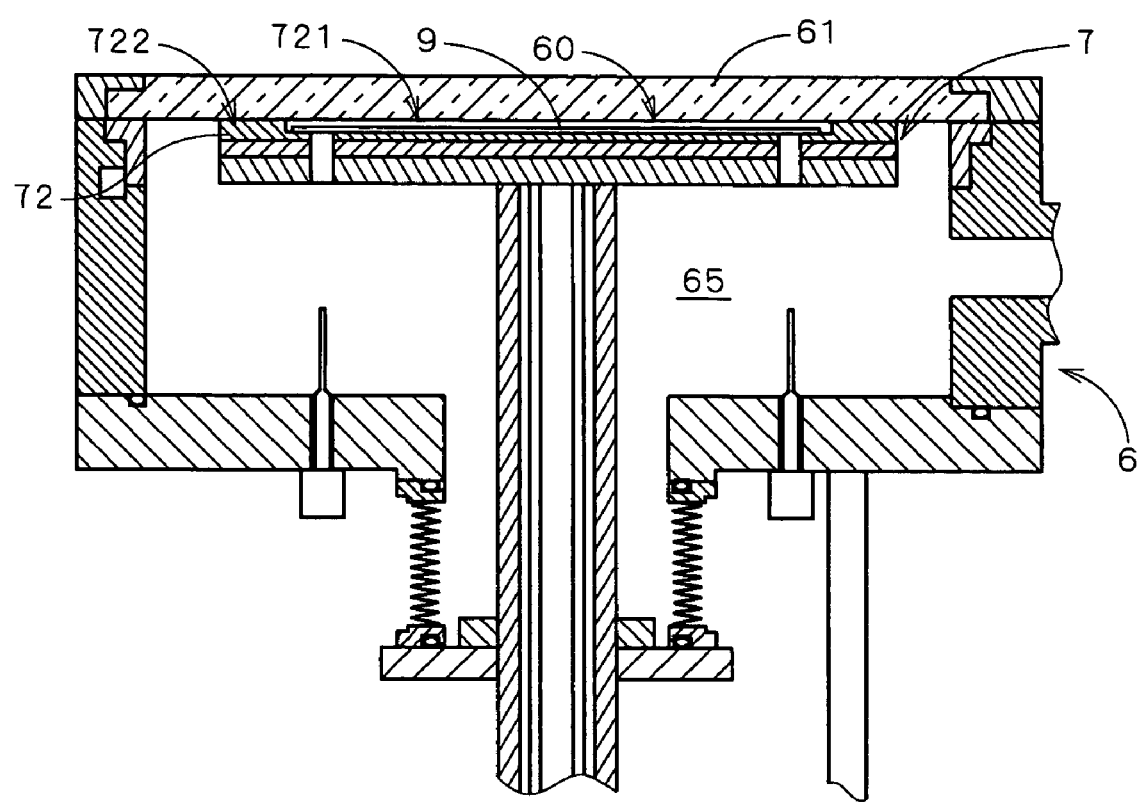
FIG. 13 is a view for explanation on closure of the recessed portion of the susceptor.

In the thermal processing apparatus 1 of FIG. 12, a position where the susceptor 72 is in contact with the transparent plate 61 for closing the upper opening 60 provided in the chamber body 6 is the processing position for the substrate 9. Specifically, in Step S16 of FIG. 6, the holding-part moving mechanism 4 (see FIG. 1) moves the holding part 7 up to the processing position and the side wall portion 722 of the susceptor 72 thereby comes into contact with a lower surface of the transparent plate 61 as shown in FIG. 13 to block the periphery of the substrate 9 by the susceptor 72 and the transparent plate 61 (Step S18). Then, like in the thermal processing apparatus 1 of FIG. 1, after the substrate 9 is preheated by the susceptor 72 (Step S17), the light emitting part 5 emits light from the outside of the upper opening 60 of the chamber body 6 into the chamber body 6 and the substrate 9 is heated by light irradiation through the transparent plate 61 which transmits the light emitted from the light emitting part 5 (Step S119). Similarly, Step S20 for opening the recessed portion 721 is achieved by the operation of Step S21.

Thus, in the thermal processing apparatus 1 of FIG. 12, the recessed portion 721 of the susceptor 72 for preheating the substrate 9 is closed by the transparent plate 61 inside the chamber body 6 with a simple construction and as a result, even if the substrate 9 is broken during the processing, it is possible to prevent the pieces of the substrate 9 from being scattered. In the thermal processing apparatus 1 of FIG. 12, in order to appropriately close the recessed portion 721 of the susceptor 72, the assembly of the thermal processing apparatus is performed so that the susceptor 72 and the transparent plate 61 should be parallel with each other with high degree.

Though the preferred embodiment of the present invention has been discussed above, the present invention is not limited to the above-discussed preferred embodiment, but allows various variations.

For example, in the light emitting part 5, the number of flash lamps 51 and layout and shape are not limited to those shown in the preferred embodiment but may be appropriately changed in accordance with conditions such as the size of the substrate 9 to be thermally processed. Krypton flash lamps may be used instead of the xenon flash lamps, and light sources other than flash lamps, such as halogen lamps, may be also used.

Like a case where halogen lamps are used as a light source for emitting light to the substrate 9, if the thermal processing of the substrate 9 is performed in a relatively longer time as compared with a case of using the flash lamps 51, in order to make the whole result of the thermal processing on all the substrates 9 uniform, a structure may be adopted in which the holding part 7 is rotated about the shaft 41 in the chamber 65.

In the above-discussed preferred embodiment, though the processing accompanied with heating is performed on the substrate 9 mainly with light emitted from the light emitting part 5, the substrate 9 may be processed only by heat given from the susceptor 72. Even in this case, since the recessed portion 721 of the susceptor 72 is closed by the cover member 21 or the transparent plate 61 (herein, both constituents may not transmit light), even if the substrate 9 is broken during the processing, it is possible to prevent the pieces of the substrate being scattered.

The constituent element for heating the susceptor 72 is not limited to the hot plate 71 but there may be a case where a lamp is additionally provided below the susceptor 72 and the susceptor 72 is heated by light emitted from the lamp. There may be another case where the susceptor 72 serving as a substrate supporting part and the hot plate 71 serving as a heating part are formed as a unit and the substrate 9 is supported substantially by the heating part.

The constituent element for supporting the cover member 21 is not limited to the pin-like supporting part which supports it from below but there may be a case where the cover member is, for example, a plate-like member which is larger than the susceptor 72 and part of the cover member whose position is outside the contact portion with the susceptor 72 during the processing is held for support. Depending on the construction of the thermal processing apparatus, the cover member and a member (support pins) for supporting the cover member are fixed to each other.

Though it is preferable that the structure including the holding part 7 and the shaft 41 used for holding and vertically moving the holding part 7 should be a T-shaped structure in terms of reduction in capacity of the closed space around the substrate 9, the structure is not limited to the T-shaped one.

Though the thermal processing apparatus is especially suitable for activation of impurities in the substrate 9 and annealing, the apparatus may be used for performing other various processings such as oxidation, CVD or the like. The thermal processing apparatus may be used for a thermal processing not only for semiconductor substrates but also for glass substrates used for flat panel displays such as liquid crystal displays or plasma displays.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus for performing a processing accompanied with heating on a substrate, comprising:
   a chamber body forming a space in which a substrate is processed;
   a substrate supporting part for supporting a lower surface of a substrate by a bottom surface of a recessed portion whose depth is larger than a thickness of said substrate and surrounding a periphery of said substrate by a side wall portion of said recessed portion inside said chamber body;
   a heating part for heating said substrate supporting part;
   a substantially plate-like cover member disposed above said substrate supporting part:
   a closing mechanism for closing said recessed portion by bringing said cover member into contact with an upper end of said side wall portion, said cover member being relatively movable onto said side wall portion while said substrate is preheated by said substrate supporting part; and
   a flash lamp disposed and operable for heating said substrate by emitting a flash light to said substrate through said cover member, said recessed portion being closed by said cover member.

2. The thermal processing apparatus according to claim 1, wherein thermal conductivity of said substrate supporting part is lower than that of a substrate.

3. The thermal processing apparatus according to claim 1, further comprising a cover supporting part for supporting said cover member,
wherein said closing mechanism relatively moves said substrate supporting part and said cover member and said cover member is thereby moved from said cover supporting part onto said side wall portion.

4. The thermal processing apparatus according to claim 1, further comprising:
a window member for closing an opening provided in said chamber body for introducing light, wherein
said flash lamp is disposed for emitting said flash light from the outside of said opening into said chamber body through said window member.

5. The thermal processing apparatus according to claim 1, wherein
said flash lamp is disposed for emitting said flash light from the outside of an opening provided in said chamber body into said chamber body,
said cover member is a member for closing said opening
said closing mechanism moves up said substrate supporting part to bring said side wall portion into contact with a lower surface of said cover members.

6. A thermal processing method for performing a processing accompanied with heating on a substrate, comprising the steps of:
loading a substrate into a chamber body;
supporting said substrate by a heated substrate supporting part inside said chamber body, said substrate supporting part supporting a lower surface of said substrate by a bottom surface of a recessed portion whose depth is larger than the thickness of said substrate and surrounding a periphery of said substrate by a side wall portion of said recessed portion, said substrate being preheated by said substrate supporting part;
closing said recessed portion by bringing a substantially plate-like cover member disposed above said substrate supporting part into contact with an upper end of said side wall portion while said substrate is preheated;
heating said substrate by emitting a flash light to said substrate through said cover member after closing said recessed portion by said cover member;
opening said recessed portion; and
unloading said substrate from said chamber body.

7. The thermal processing method according to claim 6, wherein
thermal conductivity of said substrate supporting part is lower than that of a substrate.

8. The thermal processing method according to claim 6, wherein
said substrate supporting part and said cover member are moved relatively to each other and said cover member is moved from a cover supporting part for supporting said cover member onto said side wall portion in said step of closing said recessed portion.

9. The thermal processing method according to claim 6, wherein
said flash light is emitted from the outside of an opening provided in said chamber body for introducing light into said chamber body through a window member for closing said opening in said step of heating said substrate.

10. The thermal processing method according to claim 6, wherein
said cover member is a member for closing an opening provided in said chamber body
said substrate supporting part is moved up to bring said side wall portion into contact with a lower surface of said cover member in said step of closing said recessed portion, and
said flash light is emitted from the outside of said opening into said chamber body in said step of heating said substrate.

* * * * *